US012787412B2

(12) United States Patent
Dag et al.

(10) Patent No.: US 12,787,412 B2
(45) Date of Patent: Nov. 3, 2026

(54) SEMICONDUCTOR DEVICES CONTAINING BI-METALLIC SILICIDE WITH REDUCED CONTACT RESISTIVITY

(71) Applicant: Applied Materials, Inc., Santa Clara, CA (US)

(72) Inventors: Sefa Dag, Fremont, CA (US); El Mehdi Bazizi, San Jose, CA (US); Gaurav Thareja, Santa Clara, CA (US); Avgerinos V. Gelatos, Scotts Valley, CA (US); Gang Shen, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 707 days.

(21) Appl. No.: 18/185,242

(22) Filed: Mar. 16, 2023

(65) Prior Publication Data

US 2024/0313079 A1 Sep. 19, 2024

(51) Int. Cl.
*H10D 64/62* (2025.01)
*H10D 64/01* (2025.01)

(52) U.S. Cl.
CPC ......... *H10D 64/62* (2025.01); *H10D 64/0112* (2026.01)

(58) Field of Classification Search
CPC .............. H10D 64/62; H01L 21/28518; H01L 21/76843; H01L 21/76855
See application file for complete search history.

(56) References Cited

U.S. PATENT DOCUMENTS 6,268,290 B1 * 7/2001 Taguchi .............. H10W 20/033 438/653
6,686,662 B2 * 2/2004 Merchant .......... H01L 21/76843 257/750
6,723,628 B2 * 4/2004 Matsumoto ........... H10P 14/412 438/654
2006/0019471 A1 * 1/2006 Choi ....................... H01J 1/304 438/795
2009/0001588 A1 * 1/2009 Ranade ............. H01L 21/28518 257/757

(Continued)

FOREIGN PATENT DOCUMENTS

EP 2548238 B1 4/2015

OTHER PUBLICATIONS

International Search Report and Written Opinion for PCT/US2024/017494 mailed Jun. 13, 2024, 11 pages.

(Continued)

*Primary Examiner* — Mohsen Ahmadi
(74) *Attorney, Agent, or Firm* — Kilpatrick Townsend & Stockton LLP LLP

(57) ABSTRACT

The present technology includes semiconductor devices and methods with improved contact resistivity. Semiconductor devices include a substrate base, a silicon oxide disposed on the base defining one or more features, a bi-metallic silicide layer disposed on the substrate in the one or more features, and at least a first metal layer. The bi-metallic silicide layer includes a first metal, a second metal different than the first metal, and a silicon containing compound, and includes greater than or about 0.8 E+14 per $cm^{-2}$ second metal atoms. The first metal layer includes the first metal and overlies the bi-metallic silicide layer.

10 Claims, 3 Drawing Sheets

(56) References Cited

U.S. PATENT DOCUMENTS

| | | | | |
|---|---|---|---|---|
| 2013/0292703 | A1 * | 11/2013 | Horii | H10D 30/60 257/77 |
| 2016/0372365 | A1 | 12/2016 | Tang et al. | |
| 2023/0031381 | A1 | 2/2023 | Parikh et al. | |

OTHER PUBLICATIONS

Korean Application No. 10-2025-7033916, Office Action mailed on Jan. 27, 2026, 8 pages (4 pages of original document and 4 pages of English Translation).

* cited by examiner

SEMICONDUCTOR DEVICES CONTAINING BI-METALLIC SILICIDE WITH REDUCED CONTACT RESISTIVITY

TECHNICAL FIELD

The present technology relates to methods for semiconductor processing and devices formed therefrom. More specifically, the present technology relates to methods for reducing the contact resistivity of semiconductor devices and devices incorporating such contacts.

BACKGROUND

Integrated circuits have advanced into complex devices that can include millions of transistors, capacitors, and resistors on a single chip. In the course of integrated circuit evolution, functional density (i.e., the number of interconnected devices per chip area) has generally increased while geometry size has decreased. Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate field-effect transistors (FETs) in which current flows through a semiconducting channel between a source and a drain, in response to a voltage applied to a control gate.

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. As devices shrink and more complex patterning schemes are utilized in the industry, deposition of thin films becomes a challenge. In addition, as material thicknesses continue to reduce, as-deposited characteristics of the films may have a greater impact on device performance.

Thus, there is a need for high-quality devices and structures having improved resistance, and methods of making such devices. These and other needs are addressed by the present technology.

BRIEF SUMMARY

Embodiments of the present technology include semiconductor devices and methods with improved contact resistivity. Semiconductor devices include a substrate, a silicon oxide disposed on the base defining one or more features, a bi-metallic silicide layer disposed on the substrate in the one or more features, and at least a first metal layer. The bi-metallic silicide layer includes a first metal, a second metal different than the first metal, and a silicon containing compound, and includes greater than or about 0.8 E+14 per $cm^{-2}$ second metal atoms. The first metal layer includes the first metal and overlies the bi-metallic silicide layer.

In embodiments, the semiconductor device exhibits a Schottky Barrier Height that is at least about 5% less than a Schottky Barrier Height in a semiconductor device that does not contain a bi-metallic silicide. In embodiments, the semiconductor device exhibits a Schottky Barrier Height of less than 0.39 eV. In more embodiments, the bi-metallic silicide layer includes greater than or about 3 E+14 per $cm^{-2}$ second metal atoms.

In further embodiments, the semiconductor device also includes a second metal layer that includes the second metal overlying the first metal layer. Additionally or alternatively, the second metal is titanium, zirconium, nickel, molybdenum, gold, tungsten, palladium, platinum, chromium or a combination thereof. In embodiments, the first metal is titanium, zirconium, nickel, molybdenum, gold, tungsten, palladium, platinum, chromium or a combination thereof. In yet more embodiments, the first metal is molybdenum, the second metal is titanium, and the bi-metallic silicide is a molybdenum(titanium)-silicide. In embodiments, the bi-metallic silicide layer is disposed in a p-MOS region. Additionally or alternatively, in embodiments, the bi-metallic silicide layer is disposed in a n-MOS region.

Embodiments of the present technology include a semiconductor device processing system. Systems include a first processing chamber, a second processing chamber, and a third processing chamber. Systems include a system controller configured to etch at least a first feature into an oxide on a silicon containing substrate in the first processing chamber. Systems include a system controller configured to deposit a first metal layer containing a first metal over the silicon containing substrate in the at least the first feature in the second processing chamber. Systems include a system controller configured to deposit a second metal layer containing a second metal over the first metal layer in the second processing chamber or in the third processing chamber. Systems include a system controller configured to anneal the semiconductor device, forming a bi-metallic silicide layer between the silicon containing substrate and the first metal layer.

In embodiments, the first metal is molybdenum, titanium, zirconium, nickel, or a combination thereof, and the substrate is exposed to a first metal precursor and a first metal reactant in the second processing chamber. In more embodiments, the second metal is molybdenum, titanium, zirconium, nickel, or a combination thereof, and the substrate is exposed to a second metal precursor and a second metal reactant in the third processing chamber.

Embodiments of the present technology include methods of forming semiconductor devices. Methods include etching at least a first feature into an oxide disposed on a silicon containing substrate. Methods include depositing a first metal layer containing a first metal over the silicon containing substrate in at least the first feature. Methods include depositing a second metal layer containing a second metal different than the first metal over the first metal layer. Methods include annealing the semiconductor device, forming a bi-metallic silicide layer between the silicon containing substrate and the first metal layer.

In embodiments, methods include depositing the first metal layer by exposing the substrate in the at least the first feature to a first metal precursor and a first metal reactant. In more embodiments, methods include deposing the second metal layer by exposing the first metal layer to a second metal precursor and a second metal reactant. Additionally or alternatively, embodiments include where the first metal and the second metal are individually selected from molybdenum, titanium, zirconium, nickel, or a combination thereof. In embodiments, the semiconductor device exhibits a Schottky Barrier Height that is at least about 5% less than a Schottky Barrier Height in a semiconductor device that does not contain a bi-metallic silicide. In more embodiments, the second metal is applied in the second metal layer in an amount sufficient to yield greater than or about 0.8 E+14 per $cm^{-2}$ second metal atoms in the bi-metallic silicide layer. In yet further embodiments, the bi-metallic silicide layer exhibits an adhesive energy to the substrate of at least about 3% greater than a single-metallic silicide layer to the same substrate.

Such technology may provide numerous benefits over conventional techniques. For example, embodiments of the present technology provide improved contact strength and reduced contact resistivity, even at small contact sizes. In addition, the present technology allows for control over the degree and strength of the contacts. The present technology may therefore provide for improved contacts without requiring annealing methods that may be damaging to substrates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
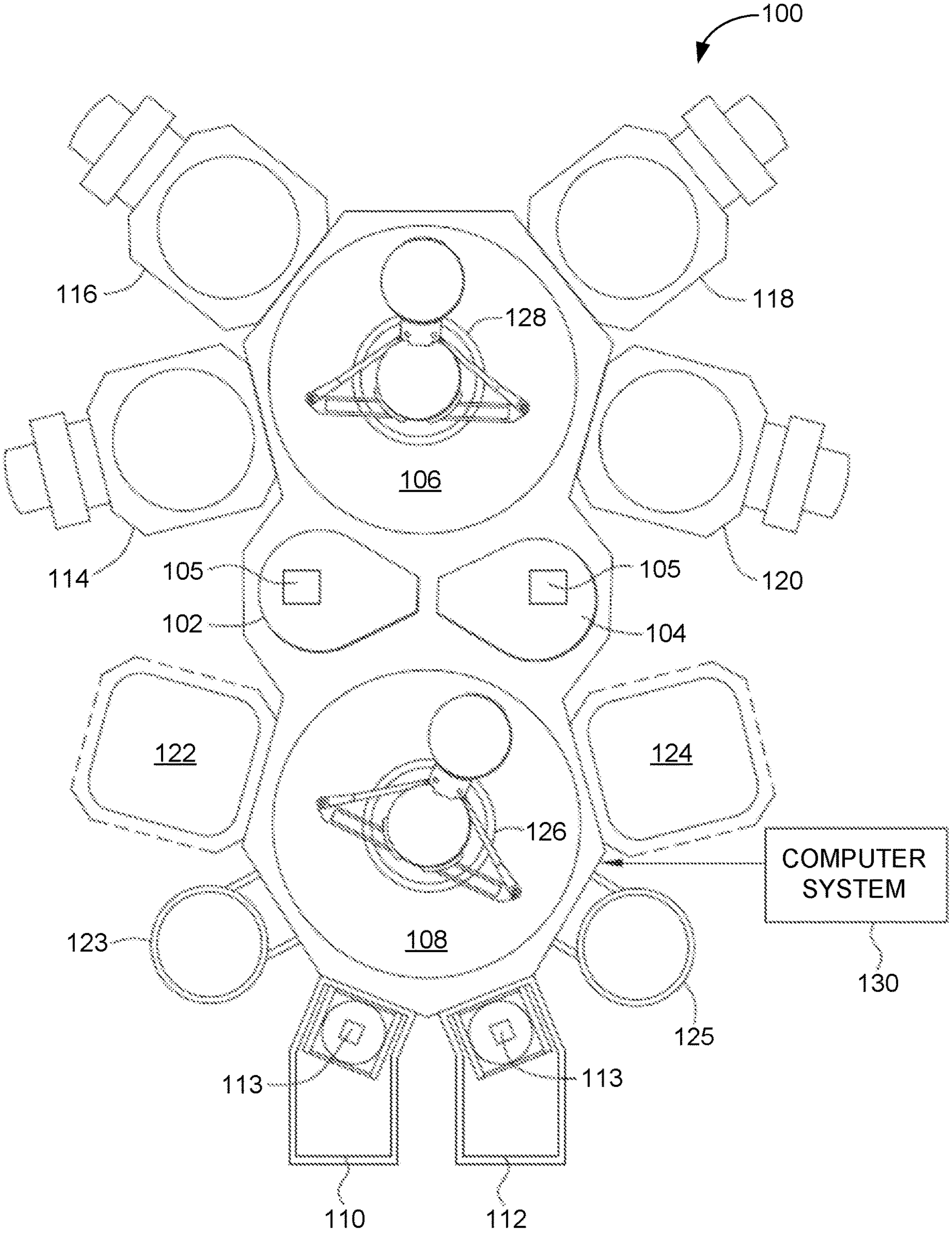
FIG. 1 shows a top plan view of an exemplary processing chamber according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Microelectronic devices are fabricated on semiconductor substrates as integrated circuits in which various conductive layers are interconnected with one another to permit electronic signals to propagate within the device. Such devices may include transistors, such as include complementary metal-oxide-semiconductors (CMOS), field effect transistors (FET), MOSFETs including both planar and three-dimensional structures, including finFETs, gate-all-around FETs, and nanosheet FETs, among other types of transistors. Drive current, and therefore speed, of a transistor is proportional to a gate width of the transistor. Faster transistors generally require larger gate width. There is a trade-off between transistor size and speed, and “fin” field-effect transistors (finFETs) and gate-all-around FETs have been developed as examples to address the conflicting goals of a transistor having maximum drive current and minimum size.

An exemplary finFET or MOSFET includes a gate electrode on a gate dielectric layer on a surface of a semiconductor substrate. Source and drain regions are provided along opposite sides of the gate electrode. The source and drain regions are generally heavily doped regions of the semiconductor substrate (p-doped or n-doped). Usually a capped silicide layer, for example, molybdenum silicide, is used to couple contacts, to the source and drain regions. However, such caps, as well as shrinking contacts has led to undesirably high contact resistivity for continued improvement in electrical properties, particularly in smaller technologies. Namely, due at least in part to limited contact surface area between source end drain regions and corresponding metal contacts, contact resistance is problematically high for improved semiconductor devices.

In addition during middle-of-line (MOL) processes, a minimum via resistance for the MOL structures is targeted. However, MOL contact dimensions are also impacted by technology scaling. Proper reduction of the contact sizes can therefore create significant increases in contact resistance. For instance, it is estimated that the epi-substrate to silicide contact can contribute greater than 80% of the total resistance of the respective decide. Attempts have been made to alter the silicidation process to improve deposition, reduce oxidation, and utilize different materials. In addition, conventional processes have suggested utilizing high temperature thermal annealing processes in an attempt to improve contact adhesion and/or interface crystallinity. However, such methods proved insufficient to improve contact resistivity to the levels required of the art, and also reduces the materials that could be utilized elsewhere on the device due to the high temperatures (e.g., films, liners, etc. that cannot withstanding high anneal temperatures).

The present technology overcomes these and other challenges by providing a strong and robust contact, thus facilitating a decrease in barrier height and lower contact resistivity. Namely, the present technology has surprisingly found that by utilizing a second metal layer deposited over the first metal layer prior to silicidation, the strength and resistivity of the contact is greatly improved. In embodiments of the present technology, a first metal layer is applied over a silicon containing layer, and a second metal, different than the first metal, is applied over the first metal layer. By utilizing such methods and devices, the present technology has surprisingly found that adhesion between layers of the contact are improved as a mixed-metal adhesion layer (e.g., bi-metallic or bi-metal silicide) is formed at the interface of the substrate and first metal. Surprisingly, the present technology found that such an approach improved contact resistivity in both p-MOS and n-MOS regions.

Although the remaining disclosure will routinely identify specific metal-oxide-semiconductor field-effect transistors (MOSFET), complementary metal-oxide semiconductors (CMOS), and components thereof, it will be readily understood that the device and methods are equally applicable to other field-effect transistors, orientations thereof, as processes for forming such devices. Accordingly, the technology should not be considered to be so limited as for use with these specific devices or methods alone. The disclosure will discuss one possible semiconductor device that may include one or more components, utilizing one or more self-aligned single diffusion breaks according to embodiments of the present technology before additional variations and adjustments to this apparatus according to embodiments of the present technology are described.

FIG. 1 illustrates a top plan view of a multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include some or all of a transfer chamber 106, a buffer chamber 108, single wafer load locks 110 and 112, although dual load locks may also be included, processing chambers 114, 116, 118, 120, 122, and 124, preheating chambers 123 and 125, and robots 126 and 128. The single wafer load locks 110 and 112 may include heating elements 113 and may be attached to the buffer chamber 108. The processing chambers 114, 116, 118, and 120 may be attached to the transfer chamber 106. The processing chambers 122 and 124 may be attached to the buffer chamber 108. Two substrate transfer platforms 102 and 104 may be disposed between transfer chamber 106 and buffer chamber 108, and may facilitate transfer between robots 126 and 128. The platforms 102, 104 can be open to the transfer chamber and buffer chamber, or the platforms may be selectively isolated or sealed from the chamber to allow different operational pressures to be maintained between the transfer chamber 106 and the buffer chamber 108. Transfer platforms 102 and 104 may each include one or more tools 105, such as for orientation or measurement operations.

The operation of the multi-chamber processing system 100 may be controlled by a computer system 130. The computer system 130 may include any device or combination of devices configured to implement the operations described below. Accordingly, the computer system 130 may be a controller or array of controllers and/or a general-purpose computer configured with software stored on a non-transitory, computer-readable medium that, when executed, may perform the operations described in relation to methods according to embodiments of the present technology. Each of the processing chambers 114, 116, 118, 120, 122, and 124 may be configured to perform one or more process steps in the fabrication of a semiconductor structure. More specifically, the processing chambers 114, 116, 118, 120, 122, and 124 may be outfitted to perform a number of substrate processing operations including dry etch processes, cyclical layer deposition, atomic layer deposition, chemical vapor deposition, physical vapor deposition, etch, pre-clean, degas, orientation, among any number of other substrate processes.

Figure 2:
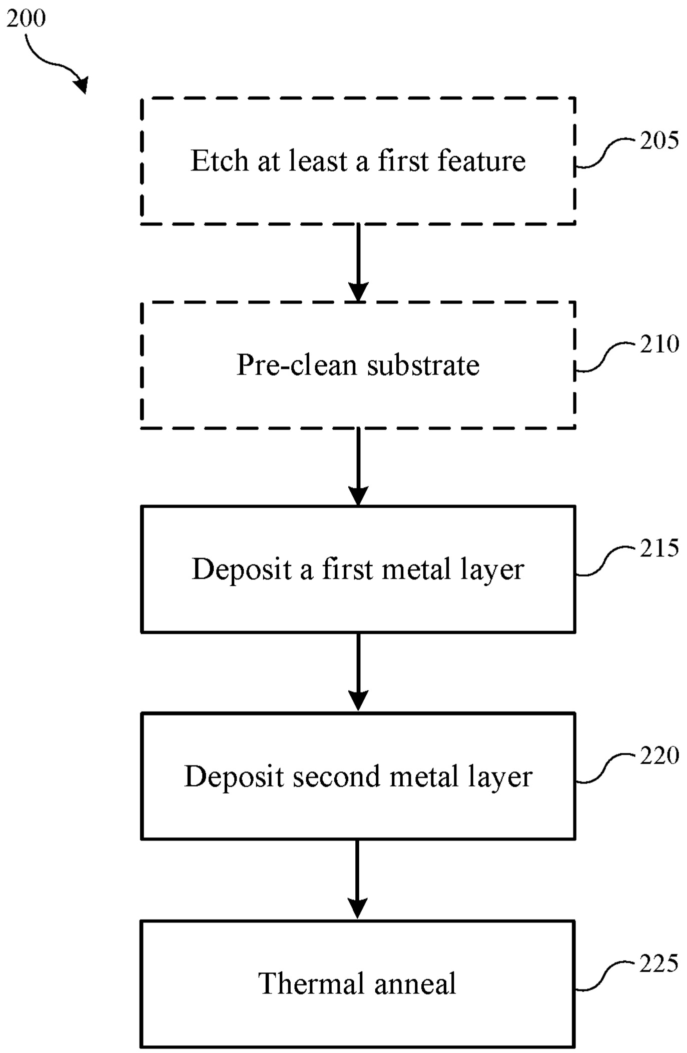
FIG. 2 shows selected operations in a formation method according to some embodiments of the present technology.

FIG. 2 shows exemplary operations in a method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing system 100, such as processing chamber 114, 116, 118, 120, 122, and/or 124 described above, or other chambers that may include components as described above. The substrate may be deposited on a substrate support, which may be a pedestal such as substrate platform 104, and which may reside in a processing region of the chamber, such as processing region 120 described above. Method 200 describes operations shown schematically in FIGS. 3A-3E, the illustrations of which will be described in conjunction with the operations of method 200. It is to be understood that FIGS. 3A-3E illustrate only partial schematic views, and a semiconductor substrate may include further components as illustrated in the figures, as well as alternative components, of any size or configuration that may still benefit from aspects of the present technology.

Figure 3A:
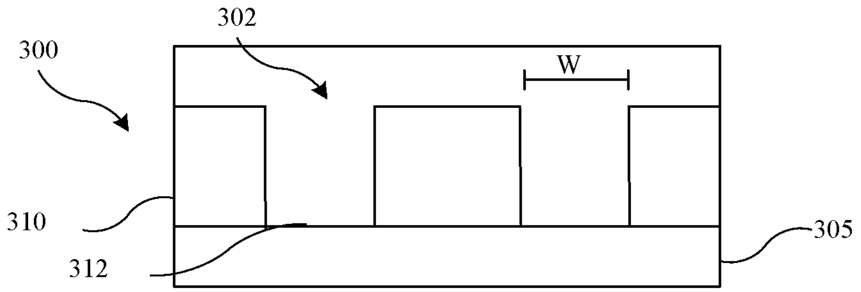
FIGS. 3A-3E show cross-sectional views of exemplary semiconductor structures according to some embodiments of the present technology.

Method 200 may or may not involve optional operations to develop the semiconductor structure to a particular polishing operation, such as one or more semiconductor processing operations to develop one or more layers of material on a substrate, clamping a substrate to a carrier head of a polishing system, or depositing one or more metal layers in one or more features 302. It is to be understood that method 200 may be performed on any number of semiconductor structures or substrates 305, as illustrated in FIG. 3A, including exemplary structure 300 on which silicon oxide 310 may be formed over substrate 305. For instance, in embodiments, an operation 205 may include transferring a substrate 305 to a deposition chamber, such as process chamber 114, to etch one or more features 302 in silicon oxide 310.

Structure 300 may illustrate a partial view of a substrate, which in embodiments may be used in n-channel and p-channel MOSFETs, FinFETs, gate-all-around FETs, complementary metal-oxide semiconductors, and nanosheet FETs, among other types of semiconductor transistor structures. The layers of material may be produced by any number of methods, including chemical vapor deposition (CVD), physical vapor deposition (PVD), atomic layer deposition (ALD), thermally enhanced chemical vapor deposition (TECVD), plasma-enhanced chemical vapor deposition (PECVD), plasma enhanced atomic layer deposition (PEALD), or any other formation technique. In embodiments, any one or more deposition methods or operations may be performed in a processing chamber, such as processing chamber 118 and/or 120 described previously. Substrate layers can include silicon oxide and silicon nitride, silicon oxide and silicon, silicon nitride and silicon, silicon and doped silicon, or any number of other materials.

However, in embodiments, the substrate 305 may be a bulk semiconductor substrate. As used herein, the term "bulk semiconductor substrate" refers to a substrate in which the entirety of the substrate is comprised of a semiconductor material. The bulk semiconductor substrate may include any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, silicon germanium, epi-substrate, gallium arsenide, or other suitable semiconducting materials. In embodiments, the semiconductor material is silicon (Si). In one or more embodiments, the semiconductor substrate 305 includes a semiconductor material, e.g., silicon (Si), carbon (C), germanium (Ge), silicon germanium (SiGe), germanium tin (GeSn), other semiconductor materials, or any combination thereof. In one or more embodiments, the substrate 305 includes one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In embodiments, the semiconductor material may be a doped material, such as n-doped silicon (n-Si), or p-doped silicon (p-Si). In embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. As discussed above, in embodiments, the present technology may provide improved mobility in both p and n-type semiconductors (also referred to p-MOS and n-MOS regions herein).

Although the following description will regularly discuss silicon oxide deposited on the substrate 305 as a dielectric material, it is to be understood that any number of dielectric materials may be used in embodiments of the present technology, and the present technology should not be limited to any particular dielectric material in which features may be formed. As illustrated in FIG. 3A, the silicon oxide 310 may be processed to form one or more recesses or features 302, such as trenches, apertures or vias, or any other structure useful in semiconductor processing. Substrate 305 may be any number of materials, such as a base wafer or substrate 305 made of silicon or silicon-containing materials, or other substrate materials as discussed above. In embodiments, methods can include optional steps of etching 205 one or more features 302 in an etching chamber, such as processing chamber 114. Although two features 302 are shown in the figure, it is to be understood that exemplary structures may have any number of features defined along the structure according to embodiments of the present technology. Thus, in embodiments, only one feature may be formed, or more than 2, such as greater than 3, such as greater than 4, such as greater than 5, such as greater than 6, such as greater than 7, such as greater than 8, such as greater than 9, such as greater than 10 features may be formed, or any ranges or values therebetween.

Nonetheless, in embodiments, an optional etch operation 205 may be a first operation in processing system 100 depending upon prior processing steps. If so, a substrate 305 may be loaded into load lock 110,112 and transferred to an etch chamber (such as process chamber 114) via robots 126, 128. Thus, the etch process may be considered to be an in-situ etch process within process system 100. However, in embodiments, the transfer may be from a first process chamber (such as process chamber 114) to a second process chamber 116, instead of loading through load locks 110,112 if a prior operation is performed according to method embodiments. Namely, as will be discussed in greater detail below, in embodiments, prevention and removal of oxides may be necessary for proper annealing of the two or more metal layers utilized for forming the bi-metallic silicide of the present technology. Thus, in aspects, processing system 100 may provide an end-to-end platform such that each operation, including transfer therebetween, may be conducted under vacuum.

However, in embodiments, it may be desirable to conduct an optional pre-clean operation 210 to remove any existing oxides, or if a full vacuum process is not feasible, either before or after etch operation 205. In embodiments, the cleaning operation (also referred to as a pre-clean operation) is any cleaning process suitable for removing an oxide layer from substrate 305. For instance, in embodiments, a plasma assisted etch process, a reactive etch or clean process, the like, or a combination thereof may be conducted in order to remove any byproducts formed on the substrate, such as surface oxidation. In embodiments, a preclean operation 210 may be conducted via a Siconi™ etch process, or any reactive etch or clean process known in the art. For instance, such a pre-clean may be selected to remove silicon oxides formed on an upper surface 312 of a substrate 305 within feature 302, as an example only. Nonetheless, in embodiments, a substrate 305 may be transferred from etch chamber 114 to a preclean chamber (such as process chamber 116) via robots 126, 128. Thus, the pre-clean process may be considered to be an in-situ clean process within process system 100.

Moreover, as discussed above, in embodiments, after a preclean process, the substrate 305 is transferred under vacuum, to a deposition chamber, such as a process chamber 118. Namely, oxide formation on the silicon-containing substrate 305 can prevent diffusion of the two or more metals into the silicon containing substrate 305. Thus, in embodiments, transfer to a deposition chamber 118 under vacuum may be necessary in order to prevent formation of further oxides after the pre-clean operation 210.

Figure 3B:
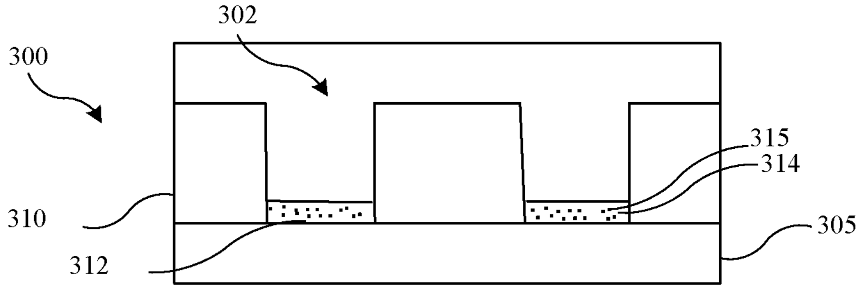

Nonetheless, in embodiments, a first metal layer 314 containing a first metal 315 is deposited over the substrate 305 in feature 302 as shown in FIG. 3B at operation 215. In embodiments, deposition can be according to any suitable method in the art, and may be conducted in a processing chamber configured as a chemical vapor deposition chamber, a physical vapor deposition chamber, an atomic layer deposition chamber, a thermally enhanced chemical vapor deposition chamber, a plasma-enhanced chemical vapor deposition chamber, an electroless deposition chamber, or a plasma enhanced atomic layer deposition chamber.

In embodiments, the first metal is tungsten, molybdenum, titanium, zirconium, nickel, hafnium, cobalt, tin, tantalum, platinum, iron, niobium, palladium, a metal-containing species thereof, alloys thereof, or combinations thereof. However, it should be understood that, in embodiments, the first metal may be a low resistivity, conductive metal as known in the art. Nonetheless, in embodiments, the first metal is molybdenum, titanium, zirconium, nickel, metal-containing species thereof, alloys thereof, or combinations thereof. In embodiments, the first metal is molybdenum, metal-containing species thereof, or alloys thereof.

Deposition of the first metal 215 may include a masking operation as known in the art to mask areas of structure 300 that it is undesirable to deposit a first metal layer 314 (e.g., all areas other than features 302). Nonetheless, deposition of the first metal layer 314 may include exposing the feature(s) 302 to a metal precursor, which may be a precursor of any one or more of the first metals discussed above, forming first metal layer 314 in one or more features 302. As used in this specification and the appended claims, the terms "reactive compound", "reactive gas", "reactive species", "precursor", "process gas" and the like are used interchangeably to mean a substance with a species capable of reacting with the substrate 305 (or substrate surface 312) or material on the substrate 305 (or substrate surface) in a surface reaction (e.g., chemisorption, oxidation, reduction). In embodiments, the precursor may be a metal vapor or plasma (e.g., when utilizing a PVD process), or may be a precursor and a reactant, as well as other precursor forms as known in the art.

After formation of the first metal layer 314, conventional processes would anneal the structure 300 in order to form a first metal-silicide via a silicidation process. However, as discussed above, such processes result in a silicide that has poor adhesion to the substrate and an unacceptably high contact resistivity (such as measured by a Schottky Barrier Height). The present technology has surprisingly found that by next depositing a second metal layer, over the first metal layer, the silicide layer formed at the interface of the substrate and the first metal layer contains a doping of second metal atoms. By driving the second metal atoms to the interface, the present technology has surprisingly found that not only is the barrier height lowered in p-MOS regions due to lowered contact resistivity, but that the strength of the contact is drastically improved, leading to surprising barrier height improvements in both p-MOS and n-MOS regions.

Thus, in embodiments, the substrate 305 is transferred under vacuum, to a deposition chamber, such as a process chamber 120. Namely, oxide formation on the first metal layer 314 can prevent diffusion of the two or more metals into the silicon containing substrate 305. Thus, in embodiments, transfer to a deposition chamber, which may be the same deposition chamber 118 or a second deposition chamber 120 under vacuum may be necessary in order to prevent formation of further oxides. Additionally or alternatively, an optional further cleaning process according to any one or more of the above described cleaning operations 210 may be conducted prior to deposition at operation 220.

Figure 3C:
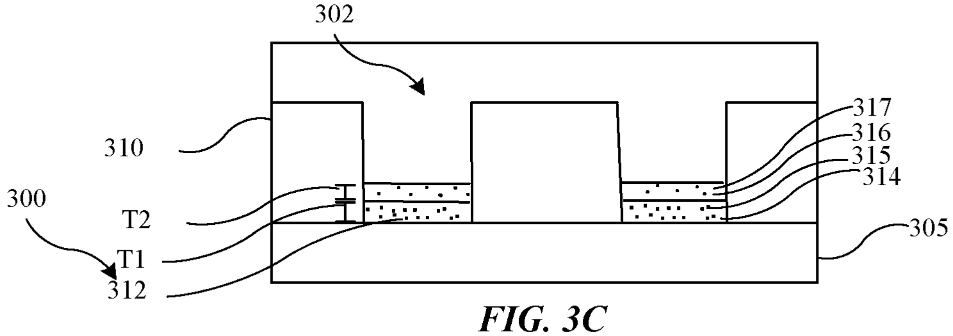

Nonetheless, in embodiments, a second metal layer 316 containing a second metal 317 is deposited over the first metal layer 314 in feature 302 as shown in FIG. 3C at operation 220. In embodiments, deposition can be according to any suitable method in the art, and may be conducted in a processing chamber configured as a chemical vapor deposition chamber, a physical vapor deposition chamber, an atomic layer deposition chamber, a thermally enhanced chemical vapor deposition chamber, a plasma-enhanced chemical vapor deposition chamber, an electroless deposition chamber, or a plasma enhanced atomic layer deposition chamber.

In embodiments, the second metal is tungsten, molybdenum, titanium, zirconium, nickel, hafnium, cobalt, tin, tantalum, platinum, iron, niobium, palladium, a metal-containing species thereof, alloys thereof, or combinations thereof, with the caveat that the second metal is different than the first metal. Thus, while each of the first metal and second metal may be selected from a similar or the same grouping of metals or species thereof, it should be understood that the second metal contains at least one metal species different than the metal or metal species of the first metal. For instance, if the first metal is molybdenum or a molybdenum containing species, as an example only, the second metal may be a metal or metal containing species of tungsten, titanium, zirconium, nickel, hafnium, cobalt, tin, tantalum, platinum, iron, niobium, palladium, a metal-containing species thereof, alloys thereof, or combinations thereof. Nonetheless, it should be understood that, in embodiments, the second metal may also be a low resistivity, conductive metal as known in the art. In embodiments, the second metal is molybdenum, titanium, zirconium, nickel, metal-containing species thereof, alloys thereof, or combinations thereof. In embodiments, the second metal is titanium, metal-containing species thereof, or alloys thereof.

Deposition of the second metal layer 316 may include a masking operation as known in the art to mask areas of structure 300 that it is undesirable to deposit a second metal layer 316 (e.g., all areas other than features 302). The mask layer may be maintained from the first metal deposition operation discussed above or may be a new masking operation. Nonetheless, deposition of the second metal layer 316 may include exposing the feature(s) 302 to a second metal precursor, which may be a precursor of any one or more of the second metals discussed above, forming second metal layer 316 over first metal layer 314 in one or more features 302.

While both the first metal layer 314 and second metal layer 316 may be formed utilizing any one or more of the deposition methods discussed above. In embodiments, the second metal layer 316 may be deposited via a physical vapor deposition (PVD) method or system. Namely, in embodiments, as second metal layer 316 is present in order to dope the first metal/primary metal and therefore be a minor constituent of the bi-metallic silicide, the second metal layer 316 may be applied as a thin film.

For instance, as illustrated in FIG. 3C, in embodiments, the first metal layer 314 may have a first height or thickness T1 and the second metal layer may have a second height or thickness T2. In embodiments, the thickness T1 of the first metal layer may be greater than or about 1.1 times the thickness T2 of the second metal layer, such as greater than or about 1.2 times, such as greater than or about 1.3 times, such as greater than or about 1.4 times, such as greater than or about 1.5 times, such as greater than or about 1.6 times, such as greater than or about 1.7 times, such as greater than or about 1.8 times, such as greater than or about 1.9 times, such as greater than or about 2 times a thickness T2 of a second metal layer 316, or any ranges or values therebetween. Of course, in embodiments, the first metal layer thickness T1 and second metal layer thickness T2 may be generally equal (e.g., about 1:1), or the second metal layer 316 may be applied as a thicker layer than first metal layer 314 depending upon the desired concentration of first metal particles 315 and second metal particles 317 in the bi-metallic silicide layer 318.

Figure 3D:
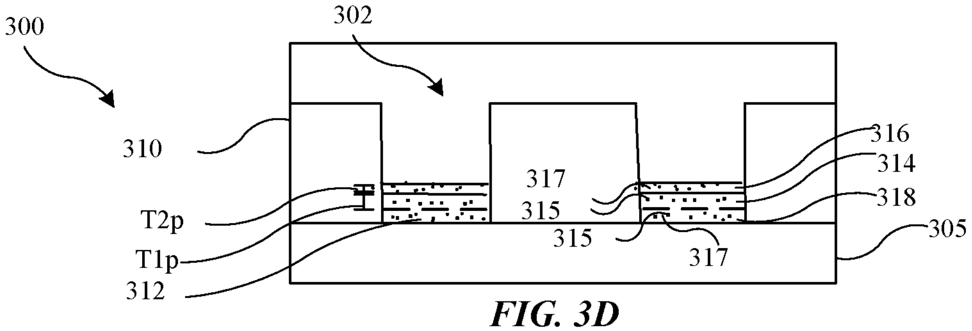

Regardless of the method utilized to form the first metal layer 314 and/or second metal layer 316, after formation of second metal layer 316, the substrate 305 is exposed to a thermal anneal process at operation 225 in order to form the silicide layer 318. As illustrated in FIG. 3D, during the diffusion process, second metal particles 317 diffuse through the first metal layer 314 towards upper surface 312 and first metal particles 315 diffuse through the first metal layer 314 to upper surface 312 to form a bi-metallic silicide layer 318 containing both first metal particles 315 and second metal particles 317 at an interface between substrate 305 and first metal layer 314.

Figure 3E:
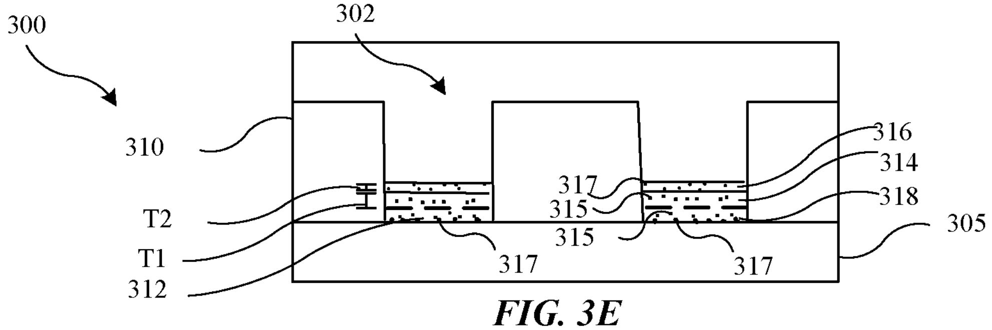

The present technology surprisingly found that even low concentrations of the second metal 317 drastically improved adhesion between the bi-metallic silicide layer 318 and substrate 305 as compared to an identical structure 300 utilizing a single metal silicide layer. Without wishing to be bound by theory, it is believed that the second metal particles 317 provide an improved bonding orientation between the highly ordered silicon containing substrate 305 and the silicide. Moreover, in embodiments, and without wishing to be bound by theory, second metal particles 317 were only observed at the interface between the substrate 305 and the bi-metallic silicide layer 318. Thus, in embodiments, the second metal particles 317 may form a bonding interface between the silicide layer 318 and the substrate 305 as illustrated in FIG. 3E and may generally not be present at an interface between the silicide layer 318 and the first metal layer 314. Nonetheless, it should be understood that the second metal particles 317 are integrated into the lattice of the bi-metallic silicide layer 318 and may therefore be considered to be part of the bi-metallic silicide layer 318. In embodiments, second metal particles 317 may be found throughout the bi-metallic silicide layer 318 alone or in addition to be located at the interface of the substrate 305 and bi-metallic silicide layer 318.

Thus, in embodiments, the substrate 305 is a silicon containing substrate, such as a silicon-germanium substrate. In more embodiments, the substrate may be an epitaxy formed silicon containing substrate, such as an epitaxy formed silicon-germanium substrate. Thus, in embodiments, the bi-metallic silicide may be a molybdenum(titanium) silicide.

Nonetheless, in embodiments, the second metal layer 316 thickness and/or anneal time and temperature may be selected so as to provide a bi-metallic silicide layer 318 that includes greater than or about 0.8 E+14 per $cm^{-2}$ second metal atoms, at the interface of the bi-metallic silicide layer 318 and substrate 305, throughout bi-metallic silicide layer 318, or a combination thereof, such as greater than or about 1 E+14 per $cm^{-2}$ second metal atoms, such as greater than or about 1.5 E+14 per $cm^{-2}$ second metal atoms, such as greater than or about 2 E+14 per $cm^{-2}$ second metal atoms, such as greater than or about 2.5 E+14 per $cm^{-2}$ second metal atoms, such as greater than or about 3 E+14 per $cm^{-2}$ second metal atoms, such as greater than or about 3.5 E+14 per $cm^{-2}$ second metal atoms, such as greater than or about 4 E+14 per $cm^{-2}$ second metal atoms, such as greater than or about 4.5 E+14 per $cm^{-2}$ second metal atoms, such as greater than or about 5 E+14 per $cm^{-2}$ second metal atoms, such as greater than or about 6 E+14 per $cm^{-2}$ second metal atoms, such as greater than or about 7 E+14 per $cm^{-2}$ second metal atoms, such as greater than or about 8 E+14 per $cm^{-2}$ second metal atoms, such as greater than or about 9 E+14 per $cm^{-2}$ second metal atoms, such as greater than or about 10 E+14 per $cm^{-2}$ second metal atoms, or any ranges or values therebetween.

Namely, the present technology has found that by utilizing a bi-metallic silicide having a second metal, a resulting semiconductor device can exhibits a Schottky Barrier Height that is at least about 5% less than a Schottky Barrier Height in a semiconductor device formed identically except that the device does not contain a bi-metallic silicide according to the present technology, such greater than or about 6% less, such as greater than or about 7% less, such as greater than or about 8% less, such as greater than or about 9% less, such as greater than or about 10% less, such as greater than or about 12.5% less, such as greater than or about 15% less, such as greater than or about 17.5% less, such as greater than or about 20% less, such as greater than or about 22.5% less, such as greater than or about 25% less, such as greater than or about 30% less, or any ranges or values therebetween.

Stated different, in embodiments, a resulting semiconductor device formed utilizing a bi-metallic silicide according to the present technology may have a Schottky Barrier Height of less than or about 0.55 eV, such as less than or about 0.5 eV, such as less than or about 0.45 eV, such as less than or about 0.4 eV, such as less than or about 0.35 eV, such as less than or about 0.325 eV, such as less than or about 0.3 eV, such as less than or about 0.275 eV, or any ranges or values therebetween.

In embodiments, the interfacial bond between the bi-metallic silicide layer and the substrate may be greatly improved. For instance, in embodiments, the bi-metallic silicide exhibits an adhesive energy (cohesive force) to the substrate that is at least about 3% greater than the adhesive energy between a single-metallic silicide layer to the same substrate, such as greater than or about 4%, such as greater than or about 5%, such as greater than or about 6%, such as greater than or about 7%, such as greater than or about 8%, such as greater than or about 9%, such as greater than or about 10%, such as greater than or about 11%, or any ranges or values therebetween. Stated differently such an interfacial bond may also be expressed as the cohesive/adhesive energy between the bi-metallic silicide and the substrate.

Nonetheless, as illustrated, it should be understood that, in embodiments, the anneal process does not fully eliminate the first metal layer 314, the second metal layer 316, or both the first metal layer 314 and second metal layer 316. However, in embodiments, it may be desired to select an anneal time and temperature that does fully diffuse one or more of the first metal layer 314 and second metal layer 316 into bi-metallic silicide layer 318 (though not shown). If one or more of the first metal layer 314 and second metal layer 316 do remain after formation of the bi-metallic silicide layer 318, the post anneal first metal layer thickness T1p may be less than a first metal layer thickness T1, such as greater than or about 1.1 times less that a pre-anneal first metal layer thickness T1, such as greater than or about 1.2 times less, such as greater than or about 1.3 times less, such as greater than or about 1.4 times less, such as greater than or about 1.5 times less, such as greater than or about 1.6 times less, such as greater than or about 1.7 times less, such as greater than or about 1.8 times less, such as greater than or about 1.9 times less, such as greater than or about 2 times less than a pre-anneal thickness T1, or any ranges or values therebetween. The post anneal second metal thickness T2p may also be less than a second metal layer thickness T2 but may exhibit less change than the first metal layer thickness, due at least in part to the lower amount of second metal particles 317 available for diffusion. Thus, in embodiments, the post anneal second metal thickness T2p may be less than or about 0.95 times a pre-anneal second metal layer thickness T2, such as less than or about 0.925 times, such as less than or about 0.9 times, such as less than or about 0.875 times, such as less than or about 0.875 times, such as less than or about 0.85 times, such as less than or about 0.825 times, such as less than or about 0.8 times the pre-anneal thickness T2, or any ranges or values therebetween.

After formation of the bi-metallic silicide layer 318, structures 300 may undergo deposition or formation of further layers or features. Additionally or alternatively, the structure 300 may be transferred to a polishing operation, an interconnect deposition operation, or any other operation as known in the art.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a metal" includes a plurality of such metals, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor device, comprising:

a substrate, a silicon oxide disposed on the substrate, wherein the silicon oxide includes one or more features;

a bi-metallic silicide layer disposed on the substrate in the one or more features, the bi-metallic silicide layer comprising a first metal, a second metal different than the first metal, and a silicon containing compound, wherein the bi-metallic silicide layer comprises greater than or about 0.8 E+14 per $cm^{-2}$ second metal atoms; and at least a first metal layer comprising a same metal as the first metal, overlying the bi-metallic silicide layer.

2. The semiconductor device of claim 1, wherein the semiconductor device exhibits a Schottky Barrier Height that is at least about 5% less than a Schottky Barrier Height in a semiconductor device that does not contain a bi-metallic silicide.

3. The semiconductor device of claim 1, wherein the semiconductor device exhibits a Schottky Barrier Height of less than 0.55 eV.

4. The semiconductor device of claim 1, wherein the bi-metallic silicide layer comprises greater than or about 3 E+14 per $cm^{-2}$ second metal atoms.

5. The semiconductor device of claim 1, further comprising a second metal layer comprising a same metal as the second metal overlying the first metal layer.

6. The semiconductor device of claim 4, wherein the second metal is titanium, zirconium, nickel, molybdenum, or a combination thereof.

7. The semiconductor device of claim 6, wherein the first metal is titanium, zirconium, nickel, molybdenum, or a combination thereof.

8. The semiconductor device of claim 7, wherein the first metal is molybdenum, the second metal is titanium, and the bi-metallic silicide layer is a molybdenum(titanium)-silicide.

9. The semiconductor device of claim 1, wherein the bi-metallic silicide layer is disposed in a p-MOS region.

10. The semiconductor device of claim 1, wherein the bi-metallic silicide layer is disposed in a n-MOS region.

* * * * *